United States Patent [19]

Marancik et al.

[11] Patent Number: 4,860,431

[45] Date of Patent: Aug. 29, 1989

[54] FABRICATION OF MULTIFILAMENT INTERMETALLIC SUPERCONDUCTOR USING STRENGTHENED TIN

[75] Inventors: William G. Marancik, Basking Ridge; Seung-Ok Hong, New Providence, both of N.J.

[73] Assignee: Oxford Superconducting Technology, Carteret, N.J.

[21] Appl. No.: 157,402

[22] Filed: Feb. 17, 1988

[51] Int. Cl.[4] .............................................. H01L 39/24
[52] U.S. Cl. .................................... 29/599; 174/125.1
[58] Field of Search .................... 29/599; 148/11.5 Q; 174/128 S

[56] References Cited

U.S. PATENT DOCUMENTS 3,918,998 11/1975 Marancik et al. .
4,224,087 9/1980 Tachikawa et al. .............. 29/599 X
4,447,946 5/1984 Marancik .
4,646,428 3/1987 Marancik et al. .

OTHER PUBLICATIONS

"Effect of Third Element Additions on the Properties of Bronze-Processed Nb$_3$Sn" in *Transactions on Magnetics*, vol. Mag-13, No. 1, pp. 651–654 (Jan. 1977).

*Primary Examiner*—P. W. Echols
*Assistant Examiner*—Taylor J. Ross
*Attorney, Agent, or Firm*—Klauber & Jackson

[57] ABSTRACT

The centers of a plurality of copper tubes are filled with an alloy of tin with a minor amount of aluminum and drawn to form Cu-Sn wires which are cabled around a core Nb wire; a plurality of these strands are provided in a copper tube, or a copper foil or finely wound copper wire and drawn to produce a multifilament wire; heat treatment is applied to cause the tin to diffuse and form the intermetalic Nb$_3$Sn at the surface of the Nb filaments to produce the ultimate superconducting wire product. The addition of a small quantity of Al to the Sn facilitates processing and improves the final product properties.

19 Claims, No Drawings

FABRICATION OF MULTIFILAMENT INTERMETALLIC SUPERCONDUCTOR USING STRENGTHENED TIN

FIELD OF THE INVENTION

This invention relates to the field of manufacture of multifilamentary intermetallic superconductors comprising Nb$_3$Sn; more particularly, it relates to such a method which does not involve the so-called "bronze process," facilitates fabrication, and results in a high current density conductor.

BACKGROUND OF THE INVENTION

The phenomenon of superconductivity, that is, zero electrical resistance, possessed by many metals at near absolute zero temperatures, has received steadily increasing attention in recent years due to the development of materials which exhibit this property at sufficiently high temperatures, while carrying relatively high currents in the presence of sufficiently great magnetic fields as to be of commercial utility. Among the more useful of the superconducting materials developed to date is the intermetallic compound Nb$_3$Sn. This material has sufficiently good superconductive properties as to render it attractive in the development of useful electrical machinery. However, the manufacture of this intermetallic compound is complicated both by the nature of the compound itself, which is not readily fabricated by simple chemical processes and which is so brittle that the bending of a conductor formed therefrom is substantially precluded, and by the preferred design of conductors using same, which generally have required many individual filaments of the superconductive material to be embedded in a matrix of a non-superconductive material, preferably a metal having high electrical conductivity such as pure Cu.

Recently developed processes for the manufacture of Nb$_3$Sn have generally involved the so-called "bronze process", in which rods or wires of Nb are dispersed throughout a matrix consisting of a CuSn bronze. The assembly is worked to a desired final size and heat treated, at which time Nb$_3$Sn is formed at the interfaces between the Nb rods and the bronze matrix by diffusion of the Sn from the bronze. See, for example, U.S. Pat. No. 3,918,998. Refinements of the bronze process include providing a quantity of good electrical conductor such as pure Cu in close proximity to the Nb$_3$Sn filaments and isolating this pure Cu from diffusion of Sn which would destroy the high electrical conductivity of pure Cu, by interposing a layer of material impermeable to Sn therebetween such as, for example, Ta; see, e.g., U.S. Pat. No. 4,205,199.

A quantity of a good electrical conductor in close proximity to the superconductive material is useful as an alternate current path or shunt in situations where it is likely that some fraction of the superconductive filaments will return to the normally-conducting state, which can happen, for example, in a rapidly-varying magnetic field.

The art, as outlined above, uses the bronze process to achieve multi-filamentary intermetallic superconductors which are stabilized by the provision of a quantity of a good electrical conductor. However, the bronze process is not without its difficulties. Chief among these is the fact that in order to improve the maximum current density carried by the superconductor, it is desirable to increase the amount of superconductive material per unit of cross-sectional area of the whole conductor. To do this it is clear that a sufficiency of tin must be provided, which could be done simply by increasing the percentage of tin in the bronze. Unfortunately, the production of a large number of extremely fine filaments demands a large number of metal-working steps—chiefly drawing—during which the bronze workhardens very quickly, necessitating frequent time-consuming and costly annealing operations. In fact, the practical maximum volume percentage of tin in the bronze which permits working is 15%; and even at this relatively low value, annealing is required roughly every two to six drawing operations, at a rate of 15-20% area reduction per pass.

Thus it can be seen that the bronze process has several drawbacks. The first is the high processing cost due to the frequent annealing required during the reduction (wire drawing). The second is the limitaation on the amount of tin available for the formation of Nb$_3$Sn and therefore the limitation on Jc.

The effect of the addition of Al to the Nb core and also to the Cu-Sn bronze matrix, has been reported in the literature, see "Effect of Third Element Additions on the Properties of Bronze-Processed Nb$_3$Sn" in *Transactions on Magnetics*, Vol. MAG-13, No. 1, pp 651-654 (January 1977).

Efforts have also been made to avoid the use of bronze. Chief among these is a method described in U.S. Pat. No. 4,646,428 to William G. Marancik et al, in which a multifilament superconductor is fabricated of the type Nb$_3$Sn by carrying out the steps of:

(a) filling the center of one or more copper tubes with Sn and drawing said tubes to form copper-Sn wires;

(b) cabling a plurality of said copper-Sn wires around a core Nb wire thereby forming the basic strand;

(c) bundling a plurality of the cables of step (b) with an eveloping layer of copper which may be in the form of a copper tube, foil or a plurality of finely wound copper wires.

This assembly may be worked up in a number of ways to the final multifilament superconductor, which may involve various cold extrusion and the like. Thus, following step (c) above, the method may be continued by:

(d) drawing the assembly of step (c) to reduce its diameter to a desired size; and (e) heat treating the product of step (d) to cause Sn to diffuse and form Nb$_3$Sn at the surface of the Nb filaments.

In one variation, a plurality of the assemblies formed in step (c) may be inserted in a copper can to form a billet and then the billet drawn to reduce the diameter thereof to a desired size, after which the heat treating diffusion step is carried out.

A diffusion barrier may be used in the first bundling—of step (c)—or in the just mentioned second bundling.

Thus, the centers of one or a plurality of copper tubes are filled with tin to form an initial composite. The percentage of tin in this composite may be freely selected, e.g. in the range of 10-50 weight % but is preferably about 20 weight % tin. Each is suitably sealed at the ends. This is drawn into a wire which is termed Cu-Sn wire.

A plurality of said Cu-Sn wires are cabled around a core Nb wire which may be Nb or predominantly Nb, viz., a NbTi wire containing about 1 weight % Ti.

A plurality of the cables are bundled and inserted in a hollow copper tube, or alternatively wrapped in a copper foil or finely wound with copper wire. The copper tube may be protected by an internal diffusion barrier typically formed of tantalum or of niobium or vanadium.

The resulting filled copper tube is drawn to reduce its diameter in accordance with requirements of the superconducting wire product. Alternatively, a plurality of said filled copper tubes is rebundled and inserted in a hollow copper can—which may also be provided with an internal diffusion barrier—to form a billet, and then the billet, suitably sealed at its ends, is drawn to reduce the diameter thereof to the desired size of the superconducting wire. Either the first bundle or the second bundle or both may be drawn into a hexagonal shape as more fully described in U.S. Pat. No. 4,447,946. The finally drawn wire is heat-treated to cause the Sn to diffuse through said copper wires and form $Nb_3Sn$ at the surface of the Nb filaments. Typically this involves heating the wire to 550° C. to 750° C., in an inert atmosphere for sufficient time to allow diffusion equilibrium conditions to be established, at which time there is maximum conversion of Nb and Sn to the intermetallic reaction product $Nb_3Sn$.

In general, hot extrusion is not used during the process. Extrusion would generally be performed at elevated temperature and pressure resulting in high local temperatures that could cause the tin to melt and form a bronze with the copper, which is unwanted for the reasons above-mentioned. Consequently, the process of said patent is carried out without resort to hot extrusion. However, extrusion at room temperature may be used.

Other variations are also useful. For example, in place of Nb wire, a multifilament Nb in Cu wire may be employed. The initial Cu-Sn composite cabled around the Nb wire can be isolated from other Nb filaments by wrapping this cable with Nb or Ta foil, and this, in turn, can have Cu cabled around it as a stabilizer. A plurality of these assemblies are then bundled and slid into a hollow copper tube as just described. In this way, each Nb filament is very close to a Cu stabilizer thus producing a very stable conductor.

Thus it can be seen that in the initial Cu-Sn composite, the tin is internalized and the process is sometimes referred to as the internal tin process.

An object thereof is to fabricate a Nb wire of very small thickness, for example, about 10 microns in diameter. By using a single Nb wire as a core and cabling around it multiple Cu-Sn wires, a basic strand of small diameter can be produced which, when a plurality of them are provided in a unit area, is adapted to achieve high current density. Tin surrounds each of the core Nb wires and is distributed in an excellent manner to enable it to diffuse to the Nb during the heat treatment step, as well as being supplied in higher amounts, viz., a higher ratio of Sn to Cu, by means of using internalized tin as compared with using bronze. As a consequence of the basic strand concept and the substantial supply of tin, since no area will be completely devoid of $Nb_3Sn$-covered Nb filaments, there are more such filaments yielding ultimately a higher current density.

However, one difficulty in practicing the above-described method of U.S. Pat. No. 4,646,428, arises from the mismatch of mechanical properties in the composite material, e.g., the assembly of step (c), which is detrimental to the processing as well as the final product properties. In said method, the Nb, Cu and Sn are co-processed and the softness of the Sn causes problems in the mechanical working and the properties of the final product. This can be seen from the melting points of the several ingredients, as shown below:

| Ingredient | Melting Point |
| --- | --- |
| Sn | 231.9° C. (450° F.) |
| Cu | 1083° C. |
| Nb | 2470° C. |

SUMMARY OF THE INVENTION

According to the invention, the aforesaid difficulty has been overcome by adding a minor amount of Al to the Sn to strengthen the Sn. The aluminum metal should be added in the minimum quantity effective to increase the tensile strength of the tin appreciably. Thus, an amount of 0.5 weight percent Al added to Sn has been found to enhance the tensile strength fourfold compared to that of Sn. Amounts of Al in the range of about 0.5 to less than about 2 weight percent based on the weight of Sn may be added to the Sn. The processing of the composite material is thereby facilitated. Surprisingly, the superconducting properties have been found not to deteriorate by the addition of Al. The concept may be used for any other composite fabrication which requires Sn in the composite.

Thus, in one aspect, the present invention is an improvement in a method for the fabrication of a multifilament $Nb_3Sn$ superconducting wire comprising the steps of:

(a) filling the center of one or more copper tubes with tin and drawing said tubes to form copper-tin wires, the percentage of Sn in the wire being in the range of 10–50 weight % Sn;

(b) cabling a plurality of said copper-tin wires around a core predominantly Nb wire;

(c) bundling a plurality of cables of step (b) with an enveloping layer of copper;

(d) drawing the assembly of step (c) to reduce its diameter; and (e) heat treating the product of step (d) to cause the Sn to diffuse and form $Nb_3Sn$ at the surface of the Nb filaments wherein the improvement comprises using in place of Sn, an alloy of Sn with a minor amount of Al that is sufficient to increase the tensile strength of the Sn.

In a modification of the process, with reference to step (b) above, one may use a copper clad predominantly Nb wire as the core. Thus, the basic strand discussed above may be modified by using a core copper clad Nb wire. This copper cladding improves bonding by first extruding a Cu clad Nb billet and drawing to wire. The copper-to-copper interface between the core wire and the surrounding copper-tin wires is more easily made than Cu-Nb.

In general, when an internal tin process is to be used, i.e., employing a Cu-Sn composite in which the tin is internalized, it will benefit by employing the alloy of tin with aluminum of this invention for supplying the tin.

DETAILED DESCRIPTION

The invention will be described in connection with the general procedure given below.

GENERAL PROCEDURE (a) A tin or tin alloy rod is slid into a copper tube and drawn to 0.023" diameter.

(b) Eleven copper clad tin wires are cabled around a 0.057" diameter Nb wire to form the basic strand.

(c) Several of the strand from step b are bundled and wrapped with Ta and/or Nb to act as a tin diffusion barrier. This is then slid into a copper tube.

(d) The assembly from step c of one inch diameter is reduced to 0.385" diameter, cold extruded to 0.220" diameter in a continuous extrusion machine followed by wire drawing to final size.

This procedure was generally followed in the examples below.

In connection with this description, certain terms used are explained as shown:

Jc or critical current density is the current the wire can carry before going normal, divided by the area of the Cu, Sn-Al alloy and niobium (everything inside the barrier).

Internal bonding relates to the many copper interfaces inside the Nb or Ta barrier. If these interfaces slip one against the other, non-uniform reduction in area will occur during processing. This will result in filament necking or breakage. If the interfaces are bonded, then slippage cannot occur and uniform filament can be obtained.

Diffusion bonding results when two surfaces that are in contact bond due to the diffusion of atoms across the interface. This is accelerated by applying heat and pressure. Given enough time, the diffusion can completely eliminate the interface.

EXAMPLE I

Composite A using Sn 0.5 wt. % Al alloy

An alloy of Sn 0.5 wt. % Al was prepared. This alloy appeared to be uniform, without intermetallics, and had an ultimate tensile strength of 5.26 tons per sq. in. which is about four times that of pure tin. The alloy was put into a copper tube, drawn and cabled around the Nb as outlined above. The copper and tin aluminum wire contained about 43 weight percent tin. 61 basic strands were bundled, wrapped with a tantalum barrier and slid into a copper tube. The composite was drawn to 0.385" diameter and extruded in the continuous extrusion machine.

A comparative example was also carried out.

Comparative Example

Composite B

This composite was fabricated in a similar manner but pure tin was used instead of a tin alloy. Tin bars were rod rolled, inserted in a copper tube and drawn to 0.029" diameter to form a wire containing 20 volume percent tin. Nine copper tin wires were cabled around a 0.057" diameter niobium wire to form the basic billet packing element. 37 of these elements were bundled, wrapped with a tantalum diffusion barrier and inserted into a copper tube. The 37 strand composite was drawn to 0.385" and extruded. The composition in area percent inside the barrier was as follows:

| Tin | 14 |
| Copper | 56 |
| Niobium | 30 |

The area percent based on the overall wire is:

| Copper (Outside the Barrier) | 47 |
| Barrier | 12 |
| Copper, Tin, and Niobium | 41 |

Processing of Composites

The two composites used for testing were the above-described Composites A and B. Suitable extrusion conditions were arrived at experimentally. The advantage may be noted of extruding the smallest feasible diameter and thereby avoiding more subsequent drawing; yet this is limited by the need to control temperature rise during extrusion so as to avoid melting the tin components of the feedstock fabricated 0.385 inch diameter rod. Temperature rise during extrusion is essentially instantaneous, and is directly proportional to extrusion pressure (net of die/chamber friction) and inversely proportional to the thermal capacity of the feedstock. Tin melting was never observed at measured extrusion pressures of 85,000 psi for the 1.75:1 reduction of feedstock diameter.

The Composites A and B were each divided into lengths for wire drawing studies. However, one length of each composite was drawn to final size without extrusion and one length of each was extruded then drawn to final size as shown in Table I.

TABLE I

| Composite A-1: | Drawn After Extrusion |
| Composite A-2: | Drawn Without Extrusion |
| Composite B-1: | Drawn After Extrusion |
| Composite B-2: | Drawn Without Extrusion |

Composite A-1 which was drawn after extrusion and contained the SnAl alloy was very successful. This Composite drew better than Composite A-2 which was not extruded and also drew better than composite B-1 and B-2.

It is believed that superior bonding was achieved in the extrusion step (comparison of composites A-1 with A-2 and B-1 with B-2) owing to the large single reduction and the heat generated in this step which resulted in enhanced diffusion bonding.

Comparison of composites A and B (Alloyed Tin vs. Pure Tin) indicates that the composite with alloyed tin (Composite A) is superior to Composite B in drawing characteristics. This is demonstrated by the fact that Composite B-1 could only be drawn to 0.050" diameter at which time wire breakage became excessive. Composite A-1 was drawn into long lengths to 0.020" diameter.

The composition of Composite A at final size is shown in Table II.

TABLE II

|  | Wire Cross Section | Area Inside Barrier |
|---|---|---|
| Cu, Sn—Al Alloy and Nb | 45 |  |
| Barrier | 14 |  |
| Copper (outside the Barrier) | 41 |  |
| Niobium |  | 37 |
| Copper |  | 36 |
| Sn—Al Alloy |  | 27 |

This wire at 0.020" diameter with 20 μm filament diameter, after heat treatment, carried a current of 143 amperes at 10T (tesla) and 4.2° K. using a criterion of 0.1 uv/cm. This is equivalent to 1500 A/mm² based on the noncopper area. The sample was heat treated for 200 hours at 680° C. indicating that a progressive long term heat treatment is not required. Optiminzation of the heat treatment and conductor geometry could lead to a much higher current density.

The large and well-dispersed tin content in the matrix with this wire construction accelerates the kinetics of the Nb₃Sn formation. Better than 80 percent of the fine diameter filament area is transformed into Nb₃Sn in 100 hours at 680° C. The structure of the Nb₃Sn, shown in a fracture sample shows a fine equiaxed grain structure which favors a high critical current density. The preliminary current density is equal to the highest reported for internal tin conductors and about double that of commercially available conductors. Improved heat treatment schedules and finer filaments will result in even higher critical current densities.

In summary, stranded billets of niobium/tin/copper having internal tin components of two different compositions were fabricated at one inch diameter, drawn to 0.385", cold extruded to 0.220" and subsequently drawn to 0.020 inch diameter in the case where the SnAl alloy was used, for heat treatment to form Nb₃Sn and superconductor evaluation. The combination of internal tin, alloy composition, and intermediate extrusion processing resulted in easier drawing to final diameter and improved internal bonding, as evidenced by a measured critical current density (based on non-copper area) of 1500 A/mm² at 10T and 4.2° K., achieved after a heat treatment of 200 hours at 680° C. This current density is the highest reported for internal tin superconductors.

While the present invention has been particularly set forth in terms of specific embodiments thereof, it will be understood in view of the instant disclosure, that numerous variations upon the invention are now enabled to those skilled in the art, which variations yet reside within the scope of the present teaching. Accordingly, the invention is to be broadly construed, and limited only by the scope and spirit of claims now appended thereto.

What is claimed is:

1. In a method for the fabrication of a multifilament Nb₃Sn superconducting wire comprising the steps of:
    (a) filling the center of one or more copper tubes with tin and drawing said tubes to form copper-tin wires, the percentage of Sn in the wire being in the range of 10-50 weight % Sn;
    (b) cabling a plurality of said copper-tin wires around a core predominantly Nb wire;
    (c) Bundling a plurality of the cables of step (b) with an enveloping layer of copper;
    (d) drawing the assembly of step (c) to reduce its diameter; and
    (e) heat treating the product of step (d) to cause the Sn to diffuse and form Nb₃Sn at the surface of the Nb filaments, the improvement which comprises using in place of tin an alloy of tin with a minor amount of aluminum that is sufficient to increase the tensile strength of the tin.

2. In a method for the fabrication of a multifilament Nb₃Sn superconducting wire comprising the steps of:
    (a) filling the center of one or more copper tubes with tin and drawing said tubes to form copper-tin wires, the percentage of Sn in the wire being in the range of 10-50 weight % Sn;
    (b) cabling a plurality of said copper-tin wires around a core predominantly Nb wire;
    (c) bunding a plurality of the cables of step (b) with an enveloping layer of copper;
    (d) drawing the assembly of step (c) to reduce its diameter; and
    (e) heat treating the product of step (d) to cause the Sn to diffuse and form Nb₃Sn at the surface of the Nb filaments, the improvement which comprises using in place of tin an alloy of tin with an amount of aluminum in the range of about 0.5 to less than 2 weight percent based on the weight of the tin.

3. A modification of the method of claim 2 in which a plurality of the assemblies formed in step (c) or step (d) are inserted in a copper can to form a billet, after which drawing and heat treating diffusion steps are carried out.

4. A modification of the method of claim 2 in which a plurality of the products of step (d) are rebundled, placed in a copper extrusion can, extruded at room temperature and then drawn to reduce the diameter thereof to the desired size of the superconducting wire, after which said heat treating diffusion step is carried out.

5. A method as set forth in claim 2 in which, in step (a), the percentage of tin in the filled copper tube is about 43 weight % tin.

6. A method as set forth in claim 2 in which, in step (c), the enveloping layer of copper is a copper tube.

7. A method as set forth in claim 2 in which, in step (c), the enveloping layer of copper is a copper foil.

8. A method as set forth in claim 2 in which, in step (c), the enveloping layer of copper is formed by a plurality of finely wound copper wires.

9. A method as set forth in claim 1 in which said enveloping layer of copper is provided internally with a diffusion barrier.

10. A method as set forth in claims 1, 2 or 9 in which the product of step (d) is subjected to cold extrusion and then drawn, prior to step (e).

11. A modification of the method of claim 7 in which a plurality of the assemblies formed in step (c) or step (d) are rebundled, provided with a diffusion barrier around them, after which drawing and heat treating diffusion steps are carried out.

12. A method as set forth in claim 3 in which the copper can is provided internally with a diffusion barrier.

13. A method as set forth in claim 2 in which the cable of step (b) is wrapped with Nb or Ta foil and then cabled with Cu wire as a stabilizer before carrying out step (c).

14. A method as set forth in claim 9 in which, in step (c) a plurality of the cables are bundled and wrapped with alternating Nb, Cu foils to provide a diffusion barrier before envelopment with a copper layer.

15. A method as set forth in claim 9 in which, in step (c) a plurality of the cables are bundled and wrapped with alternating Nb, Cu foils to provide a diffusion barrier, inserted in a copper tube, drawn, then a plurality of such assemblies are rebundled, placed in a copper extrusion can, extruded at room temperature and then drawn to reduce the diameter thereof to the desired size of the superconducting wire, after which said heat treating diffusion step is carried out.

16. A method as set forth in claim 9 in which, in step (c) a plurality of the cables are bundled and wrapped with alternating Nb, Cu foils to provide a diffusion barrier, inserted in a copper tube, drawn, then a plurality of such assemblies are rebundled, drawn, and once more rebundled, placed in a copper tube and processed to final size without extrusion.

17. In a method for the fabrication of a multifilament Nb$_3$Sn superconducting wire wherein copper-tin wires are employed, in which the tin is internalized, and are mechanically worked together with predominantly Nb wires and copper employed as a stabilizer, the improvement for overcoming the dissimilar mechanical properties of the composited materials which comprises employing an alloy of tin containing an amount of aluminum in the range of about 0.5 to less than 2 weight % based on the weight of the tin, for supplying the tin.

18. A basic strand useful in the production of a multifilament Nb$_3$Sn superconductor which comprises a predominantly Nb wire core and cabled around said core a plurality of copper clad tin wires in which the tin contains a minor amount of aluminum sufficient to increase the tensile strength of the tin.

19. A modification of the basic strand as set forth in claim 18 in which a copper clad predominantly Nb wire is used as the core.

* * * * *